(12) United States Patent
Lee

(10) Patent No.: US 7,470,980 B2
(45) Date of Patent: Dec. 30, 2008

(54) APPARATUS AND METHOD FOR MANUFACTURING A DISPLAY DEVICE SUBSTRATE

(75) Inventor: Woo-jae Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 105 days.

(21) Appl. No.: 11/493,045

(22) Filed: Jul. 25, 2006

(65) Prior Publication Data
US 2007/0224717 A1    Sep. 27, 2007

(30) Foreign Application Priority Data
Jul. 25, 2005    (KR) ..................... 10-2005-0067518

(51) Int. Cl.
*H01L 23/02* (2006.01)
(52) U.S. Cl. ............... 257/678; 257/479; 257/718; 257/726; 257/727; 438/30; 438/106; 438/478
(58) Field of Classification Search ............ 438/30; 257/479, 678, 718, 727
See application file for complete search history.

(56) References Cited

U.S. PATENT DOCUMENTS

2002/0180106 A1 * 12/2002 Ogata et al. ............ 264/272.11
2005/0067094 A1 * 3/2005 Chen et al. ................. 156/269

FOREIGN PATENT DOCUMENTS

| JP | 2002-353291 | 12/2002 |
| JP | 2003 197597 | 7/2003 |
| JP | 2004-64007 | 2/2004 |
| KR | 10-2004-0079446 | 9/2004 |

OTHER PUBLICATIONS

Patent Abstracts of Japan, Publication No. 2002-353291, Dec. 6, 2002, 1 p.
Patent Abstracts of Japan, Publication No. 2004-064007, Feb. 26, 2004, 1 p.
English Language Abstract, Publication No. 2004-079446.

* cited by examiner

*Primary Examiner*—Walter L Lindsay, Jr.
*Assistant Examiner*—Abdulfattah Mustapha
(74) *Attorney, Agent, or Firm*—MacPherson Kwok Chen & Heid, LLP.; David S. Park

(57) ABSTRACT

An apparatus and method for manufacturing a display device substrate are provided. In one embodiment, the apparatus comprises a clamp for clamping an edge of a plastic substrate, and a tension member applying tension along a surface of the plastic substrate by interacting with the clamp to strain the plastic substrate. Advantageously, the flexible plastic substrate is substantially prevented from deflecting in a manufacturing process thereby reducing defects in the display device substrate.

19 Claims, 5 Drawing Sheets ic resins.

APPARATUS AND METHOD FOR MANUFACTURING A DISPLAY DEVICE SUBSTRATE

CROSS-REFERENCE TO RELATED APPLICATIONS

This application claims the benefit of Korean Patent Application No. 2005-0067518, filed on Jul. 25, 2005, in the Korean Intellectual Property Office, which is hereby incorporated by reference for all purposes as if fully set forth herein.

BACKGROUND OF THE INVENTION

1. Field of the Invention

The present invention relates to an apparatus and a method for manufacturing a display device substrate, and more particularly, to an apparatus and a method for manufacturing a display device substrate including a plastic substrate.

2. Description of the Related Art

Display devices, such as a plasma display panel (PDP), an organic light emitting diode (OLED), and a liquid crystal display (LCD), are known. The LCD includes an LCD panel, a backlight unit, and a driving part. The LCD panel includes a thin film transistor (TFT) substrate on which TFTs are formed, a color filter substrate on which color filters are formed, and a liquid crystal layer interposed between both substrates. Recently, plastic has been used for a base substrate of both substrates, which is inexpensive, not easily broken by impact, thin, and flexible as compared with glass so as to be advantageous for forming a portable display device.

However, the plastic substrate deflects while being patterned due to its flexibility, and therefore patterns may not be properly formed. To solve this disadvantage, a support body may be formed on a rear of the plastic substrate. Then, the plastic substrate is patterned while placed on the support body to prevent deflecting. However, the support body may expand due to heat generated in a patterning process, thereby the display device substrate deflects due to a bimetal effect caused by a difference of coefficients of thermal expansion between the support body and the plastic substrate.

SUMMARY OF THE INVENTION

The present invention provides an apparatus and method for manufacturing a display device substrate preventing a flexible plastic substrate from deflecting in a manufacturing process to reduce defects of the display device substrate.

According to an embodiment of the invention, there is provided an apparatus for manufacturing a display device substrate comprising a plurality of clamps clamping edges of a plastic substrate; and a tension member applying tension along a surface of the plastic substrate by interacting with the clamp to strain the plastic substrate.

According to an embodiment of the invention, the tension member includes a support part disposed around the plastic substrate and a tension unit of which one end portion is connected to the clamp and of which the other portion is connected to the support part to form tension.

According to an embodiment of the invention, the plastic substrate has a rectangular shape and the clamp clamps a pair of opposite edges of the plastic substrate.

According to an embodiment of the invention, the pair of edges are long sides of the plastic substrate.

According to an embodiment of the invention, the clamp is formed of stainless steel.

According to an embodiment of the invention, the clamp is formed of synthetic resins.

According to an embodiment of the invention, the clamp is formed in a bar shape.

According to an embodiment of the invention, the tension unit is an extension spring.

According to an embodiment of the invention, the apparatus for manufacturing the display device substrate further comprises a moving prevention unit adhering to a rear of the plastic substrate so that the plastic substrate does not move.

According to an embodiment of the invention, the moving prevention unit is an electrostatic chuck.

According to an embodiment of the invention, one of the tension member and the clamp is formed of a magnet and the other thereof is formed of ferromagnetic metal.

According to an embodiment of the invention, the tension member and the clamp are formed of a magnet.

According to an embodiment of the invention, the tension member and the clamp are separated from each other.

According to an embodiment of the invention, the magnet is an electromagnet.

According to an embodiment of the invention, the apparatus for manufacturing the display device substrate further comprises an electric current providing unit providing an electric current to the electromagnet.

According to an embodiment of the invention, the metal is formed of at least one of iron, nickel, and cobalt.

According to an embodiment of the invention, there is provided a method for manufacturing a display device substrate comprising fixing a plastic substrate and straining the plastic substrate by applying tension therealong; and forming a pattern on the plastic substrate under condition of strain.

According to an embodiment of the invention, the plastic substrate is heated at 120° C. or more while forming the pattern.

According to an embodiment of the invention, a thickness of the plastic substrate is 0.2 mm or less.

According to an embodiment of the invention, the fixing the plastic substrate is performed by a clamp clamping edges of the plastic substrate.

According to an embodiment of the invention, the tension is applied by a tension member interacting with the clamp.

According to an embodiment of the invention, the tension member and the clamp are formed of an electromagnet and metal of a ferromagnetic, respectively, and the straining the plastic substrate comprises providing electric current to the electromagnet.

According to an embodiment of the invention, the applying tension is performed by an electrostatic chuck, which is disposed in a rear of the plastic substrate so that the plastic substrate does not move, while the plastic substrate does not move.

Additional features of the invention will be set forth in the description which follows, and in part will be apparent from the description, or may be learned by practice of the invention. The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly below.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

Figure 1:
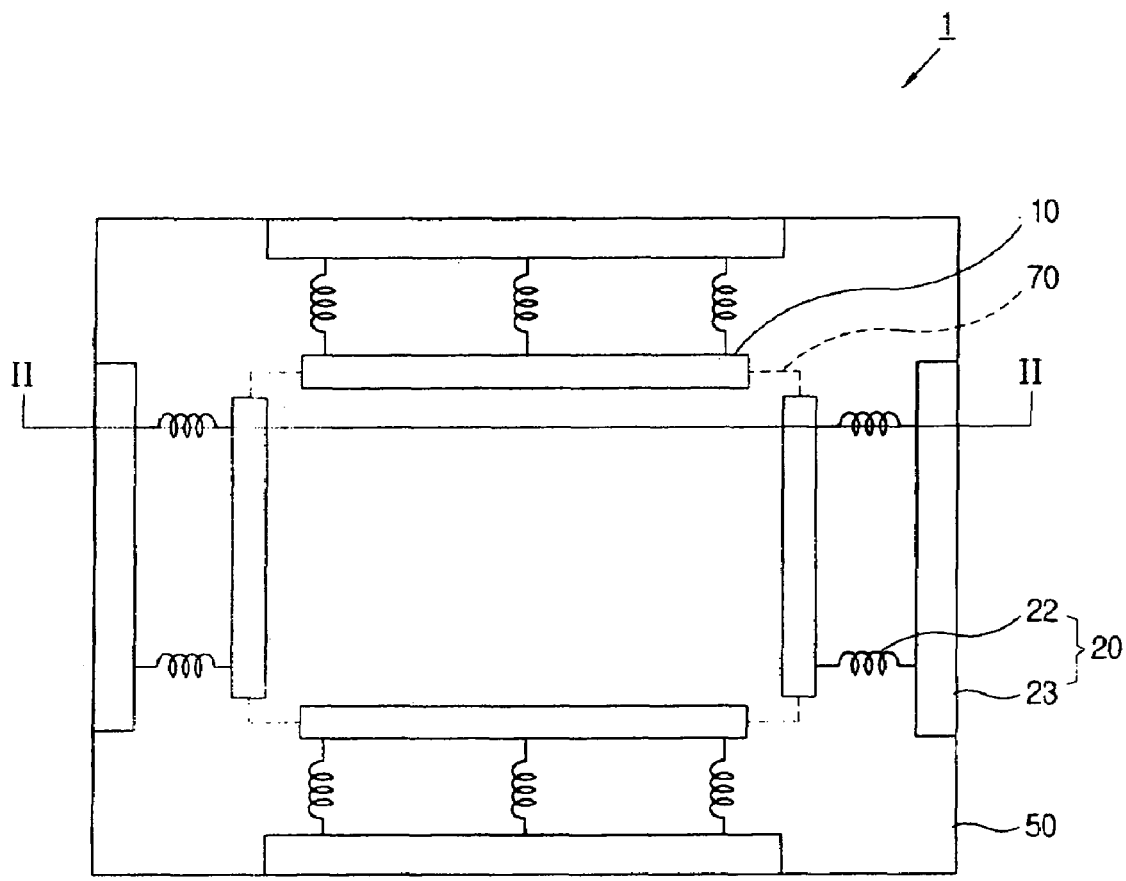
FIG. 1 is a plane view of an apparatus for manufacturing a display device substrate according to a first embodiment of the invention.

Embodiments of the present invention and their advantages are best understood by referring to the detailed description that follows. It should be appreciated that like reference numerals are used to identify like elements illustrated in one or more of the figures. It should also be appreciated that the figures may not be necessarily drawn to scale.

DETAILED DESCRIPTION

Reference will now be made in detail to the embodiments of the present invention, examples of which are illustrated in the accompanying drawings, wherein like reference numerals refer to like elements throughout.

Figure 2:
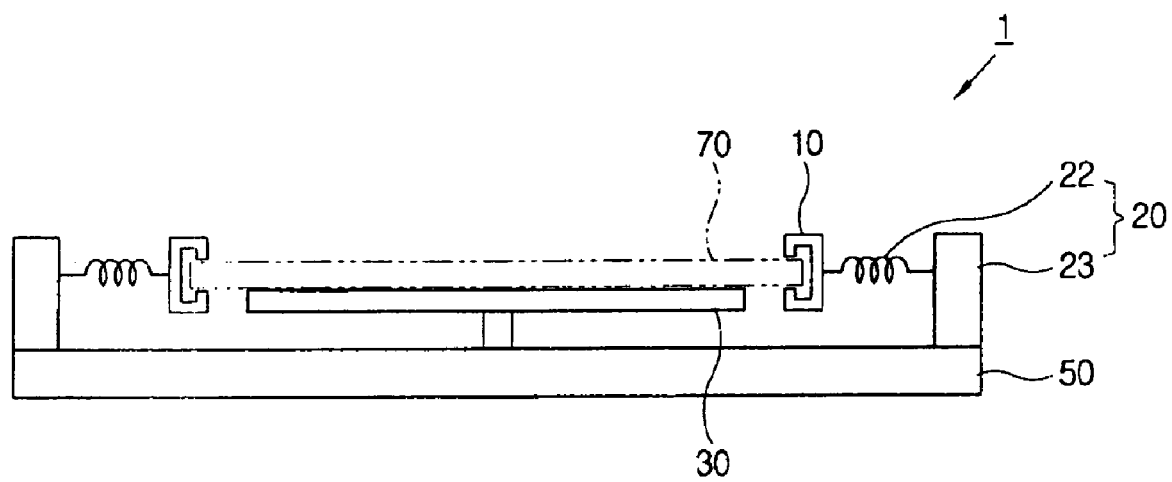
FIG. 2 is a sectional view of the apparatus for manufacturing a display device substrate, taken along line II-II in FIG. 1.

FIG. 1 is a plane view of an apparatus for manufacturing a display device substrate according to a first embodiment of the present invention, and FIG. 2 is a sectional view of the apparatus for manufacturing a display device substrate, taken along line II-II in FIG. 1.

Referring now to FIGS. 1 and 2, an apparatus 1 for manufacturing a display device substrate according to a first embodiment of the invention includes a clamp 10, a tension member 20, an electrostatic chuck 30, and a base plate 50.

A plurality of clamps 10 clamp four sides of a plastic substrate 70, which is a base substrate of the display device substrate, to apply tension along a surface of the plastic substrate 70 while interacting with the tension member 20. In one example, the clamp 10 may be made of stainless steel, which is strong, or in another example, synthetic resins, which do not react to the plastic substrate 70. The clamp 10 is formed in a bar shape in a further example. One clamp 10 may clamp the majority of one side of the plastic substrate 70 to operate in tight combination with an opposing clamp 10, thereby preventing the clamp 10 from being separated from the plastic substrate 70 while the tension member 20 applies the tension to the plastic substrate 70. In one example, if the plastic substrate 70 is small, a pair of clamps 10 may clamp a pair of opposite long sides of the substrate 70. Therefore, the plastic substrate 70 is prevented from deflecting during processing.

A side of the clamp 10 is connected to the tension member 20 which applies the tension to the plastic substrate 70. The tension member 20 includes a tension unit 22 and a support part 23 to support the tension unit 22.

The support part 23 supports the tension unit 22 to maintain the tension while the tension unit 22 applies the tension to the plastic substrate 70. The support part 23 is fixed to the base plate 50.

One end portion of the tension unit 22 is connected to the clamp 10 and the other end portion of the tension unit 22 is connected to the support part 23. The tension unit 22 applies the tension along the surface of the plastic substrate 70 so that the plastic substrate 70 does not deflect while the plastic substrate 70 is patterned. The tension unit 22 is an extension spring in the first embodiment of the invention. The extension spring is made of metal which has an excellent elasticity to revert to its original state.

The electrostatic chuck 30 is disposed behind the plastic substrate 70 so that the plastic substrate 70 does not move.

The electrostatic chuck 30 is detachable and uses static electricity to fix the plastic substrate 70 in place although not in direct contact with the plastic substrate 70. The electrostatic chuck 30 is detachable by applying or removing Johnson-Rahbek forces.

Thus, the plastic substrate 70 is strained (i.e., pulled, stretched, or stressed) to provide tension along the plastic substrate 70 by the apparatus 1 for manufacturing the display device substrate during a manufacturing process. Accordingly, deflection of the plastic substrate 70 is substantially eliminated or reduced while being patterned, thereby reducing defects of the display device substrate.

While a plurality of clamps and tension members have been illustrated and described above, it is noted that in other embodiments, a single clamp 10 and a single tension member 20 may be used to clamp a side of the plastic substrate and to strain the substrate while other sides of the plastic substrate are fixed in place.

Figure 3:
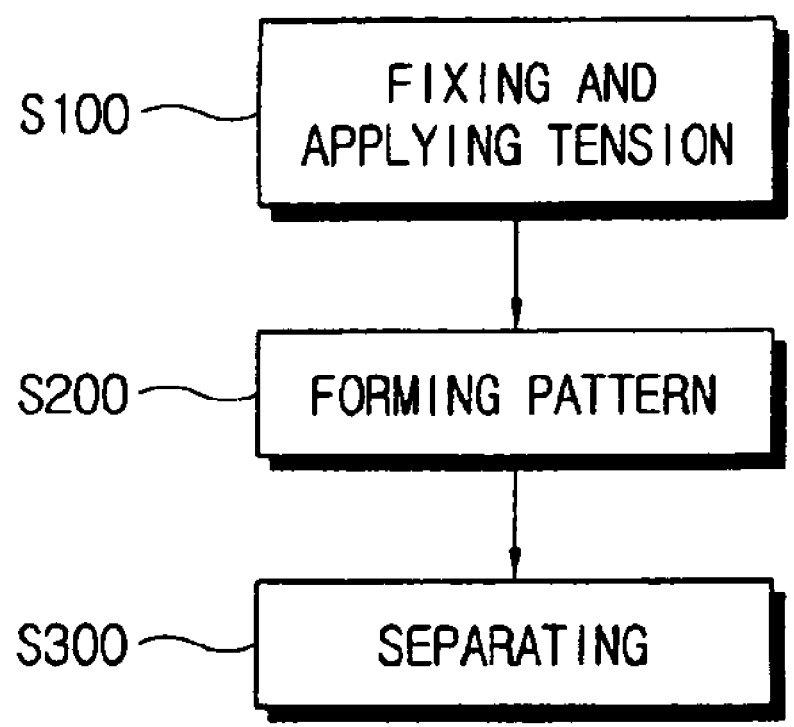
FIG. 3 is a flow chart to illustrate a method for manufacturing the display device substrate according to the first embodiment of the invention.

Referring now to FIG. 3 in conjunction with FIGS. 1 and 2, a method for manufacturing a display device substrate using the apparatus for manufacturing the display device substrate will be described. FIG. 3 is a flow chart illustrating a method for manufacturing a display device substrate according to the first embodiment of the present invention.

At operation S100, the plastic substrate 70 is fixed to the apparatus 1 for manufacturing the display device substrate and is applied with tension via clamps 10. In one example, each of four clamps 10 clamps one of four sides of the rectangular plastic substrate 70. A side of the clamp 10 is connected to the tension unit 22 of the tension member 20 generating the tension. The tension unit 22 is an extension spring in one embodiment. Therefore, when the clamp 10 is pulled to clamp the plastic substrate 70, the tension unit 22 of the extension spring stretches. Accordingly, the tension unit 22 gets elasticity, which is applied to the tension along the plastic substrate 70 so that the plastic substrate 70 is strained so as not to deflect.

Meanwhile, the electrostatic chuck 30, disposed behind the plastic substrate 70, is used to form the Johnson-Rahbek force in this process. When static electricity operates between the electrostatic chuck 30 and the plastic substrate 70, the plastic substrate 70 is fixed and the middle of the plastic substrate 70 does not deflect downwardly due to weight.

At operation S200, the plastic substrate 70 is patterned while being applied with tension. Accordingly, deflection of the plastic substrate 70 (due to heat generated while being patterned as well as the weight) is reduced. Therefore, temperature may be increased to form patterns easily in a heat process, and the patterns may be accurately formed though the plastic substrate 70 is heated at 120° C. or more, thereby reducing time and enhancing efficiency in the manufacturing process. Here, the plastic substrate 70 may be used for a TFT substrate of the LCD to form patterns of a gate line assembly, a data line assembly, a semiconductor layer, a pixel electrode, or the like. The plastic substrate 70 may also be used for a color filter substrate of the LCD to form patterns of a black matrix, a color filter, a common electrode, or the like. Further, the plastic substrate 70 may be used for an OLED to form patterns of a TFT, a hole injecting layer, a light emitting layer, a common electrode, or the like.

The substrate is more susceptible to deflecting as the plastic substrate 70 is made thinner. Advantageously, the method and apparatus for manufacturing a display device substrate according to the present invention allows for a plastic substrate 70 to be made to about 0.2 mm thick or less, thereby being advantageously light and slim.

At operation S300, after a pattern is formed, the plastic substrate 70 is separated from the clamp 10 to finish manufacturing the display device substrate.

Figure 4:
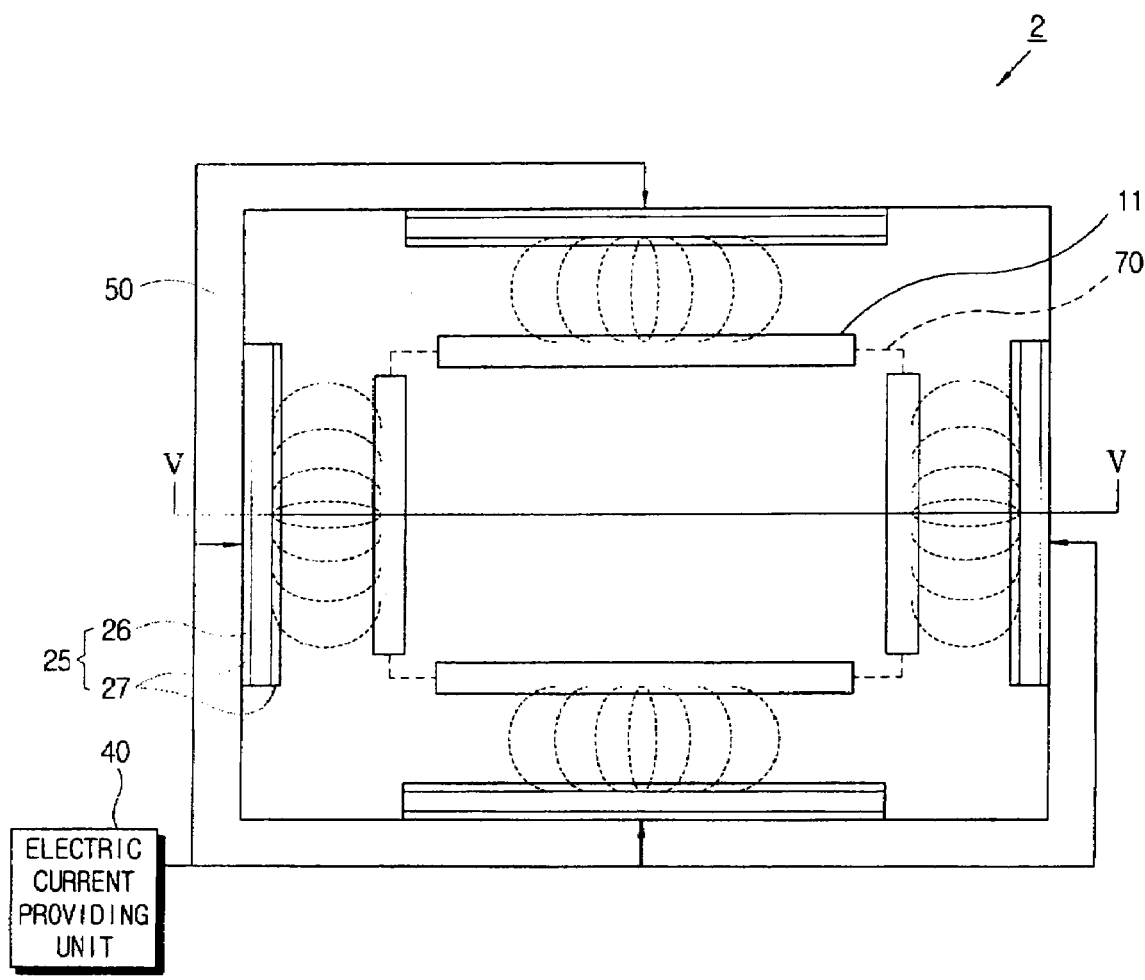
FIG. 4 is a plane view of an apparatus for manufacturing a display device substrate according to a second embodiment of the invention.
Figure 5:
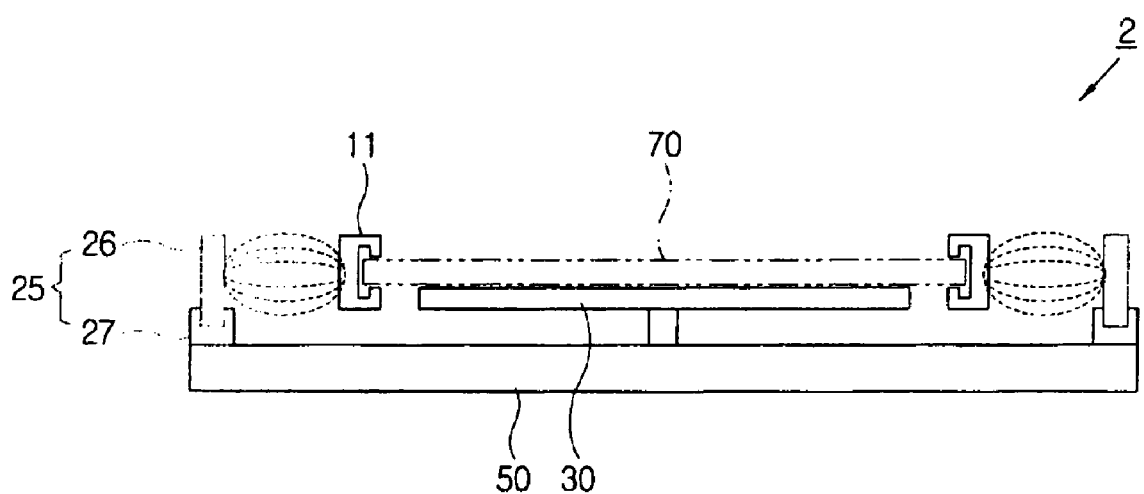
FIG. 5 is a sectional view of the apparatus for manufacturing a display device substrate, taken along line V-V in FIG. 4.

An apparatus for manufacturing a display device substrate according to a second embodiment of the invention will now be described with reference to FIGS. 4 and 5. FIG. 4 is a plane view of an apparatus for manufacturing a display device substrate according to this second embodiment of the invention; and FIG. 5 is a sectional view of the apparatus for manufacturing a display device substrate, taken along the line V-V in FIG. 4.

An apparatus 2 for manufacturing the display device substrate according to the second embodiment of the present invention includes a tension member 25 comprising a tension unit 26 made of an electromagnet and a support part 27 supporting the tension unit 26. A clamp 11, made of a ferromagnetic metal, in one example, is attracted to the electromagnet. The ferromagnetic metal may include at least one of iron, nickel, and cobalt. Also, the apparatus for manufacturing the display device substrate 2 includes an electric current providing unit 40 which provides an electric current to the magnetic field, which allows for the interaction between the clamp 11 and a substrate 70.

Thus, the tension unit 26 generates the tension between the tension member 25 and the clamp 11 though not directly contacting with the clamp 11, and the tension is applied along a surface of the plastic substrate 70, thereby reducing deflection of the plastic substrate 70.

A method for manufacturing a display device substrate according to the second embodiment of the invention is substantially the same as the method according to the first embodiment of the present invention. The following are distinctive features according to the second embodiment.

The plastic substrate 70 may be fixed and applied with the tension at the same time, as in the first embodiment or the plastic substrate 70 may be fixed/clamped first, and then applied with tension as in the second embodiment. That is, the clamp 11 clamps the plastic substrate 70 under a condition in which magnetism is not formed. Thereafter, the electric current providing unit 40 provides electric current to the tension unit 26 to form magnetic fields, thereby generating the tension between the clamp 11 and the tension unit 26 to apply to the plastic substrate 70. Thus, under the condition that the magnetic field is not formed, the clamp 11 easily clamps the plastic substrate 70 to enhance efficiency in the manufacturing process.

The embodiments described above may be modified. In one example, the tension unit 26 is formed of the electromagnet in the second embodiment, while it may be formed of a permanent magnet. Also, the clamp 11 is made of a magnet, and not a ferromagnetic metal to form the tension between itself and the tension unit 26.

It will be apparent to those skilled in the art that various modifications and variation can be made in the present invention without departing from the spirit or scope of the invention. Thus it is intended that the present invention cover the modifications and variations of this invention provided they come within the scope of the appended claims and their equivalents.

What is claimed is:

1. An apparatus for manufacturing a display device substrate, comprising:
   a clamp for clamping an edge of a plastic substrate; and
   a tension member operably coupled to the clamp for straining the plastic substrate during processing.

2. The apparatus of claim 1, wherein the tension member includes a support part coupled to a base plate and a tension unit of which a first end portion is connected to the clamp and of which a second end portion is connected to the support part.

3. The apparatus of claim 1, further comprising:
   a plurality of clamps for clamping a plurality of edges of the plastic substrate; and
   a plurality of tension members operably coupled to the plurality of clamps.

4. The apparatus of claim 3, wherein the plastic substrate has a rectangular shape and opposite edges of the plastic substrate are clamped by a pair of the plurality of clamps.

5. The apparatus of claim 4, wherein the opposite edges are longer sides of the plastic substrate.

6. The apparatus for of claim 1, wherein the clamp is formed of one of stainless steel and synthetic resins.

7. The apparatus of claim 1, wherein the clamp is formed in a bar shape.

8. The apparatus of claim 2, wherein the tension unit is an extension spring.

9. The apparatus of claim 1, further comprising a moving prevention unit operably coupled to a rear of the plastic substrate so that the plastic substrate does not move.

10. The apparatus of claim 9, wherein the moving prevention unit is an electrostatic chuck.

11. The apparatus of claim 1, wherein one of the tension member and the clamp is formed of a magnet and the other thereof is formed of a ferromagnetic metal.

12. The apparatus of claim 1, wherein the tension member and the clamp are formed of a magnet.

13. The apparatus of claim 12, wherein the tension member and the clamp are separated from each other.

14. The apparatus of claim 12, wherein the magnet is an electromagnet.

15. The apparatus of claim 14, further comprising an electric current providing unit providing an electric current to the electromagnet.

16. The apparatus of claim 11, wherein the tension member and the clamp are separated from each other.

17. The apparatus of claim 11, wherein the magnet is an electromagnet.

18. The apparatus of claim 17, further comprising an electric current providing unit providing an electric current to the electromagnet.

19. The apparatus of claim 11, wherein the metal is formed of at least one of iron, nickel, and cobalt.

* * * * *